United States Patent
Guo et al.

(10) Patent No.: US 10,039,214 B2
(45) Date of Patent: Jul. 31, 2018

(54) HEAT SPREADER AND POWER MODULE

(71) Applicant: DELTA ELECTRONICS (SHANGHAI) CO., LTD, Shanghai (CN)

(72) Inventors: Guangwei Guo, Shanghai (CN); Shijie Chen, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 14/972,400

(22) Filed: Dec. 17, 2015

(65) Prior Publication Data

US 2017/0042065 A1   Feb. 9, 2017

(30) Foreign Application Priority Data

Aug. 6, 2015   (CN) ...................... 2015 2 0588015 U (51) Int. Cl.
*H05K 7/20*   (2006.01)
(52) U.S. Cl.
CPC .................................. *H05K 7/209* (2013.01)
(58) Field of Classification Search
CPC ......... H01L 21/823857; H01L 29/4908; H01L 29/42372; H05K 7/20409
See application file for complete search history.

(56) References Cited

U.S. PATENT DOCUMENTS

| | | | | |
|---|---|---|---|---|
| 5,398,160 A | * | 3/1995 | Umeda | H01L 23/057 257/711 |
| 9,220,184 B2 | * | 12/2015 | Ranjan | H05K 7/20336 |
| 2004/0207053 A1 | * | 10/2004 | Yamashita | H01L 23/367 257/675 |
| 2010/0091464 A1 | * | 4/2010 | Ohnishi | H01L 23/053 361/723 |
| 2014/0029201 A1 | * | 1/2014 | Yang | H01L 23/36 361/707 |
| 2015/0048068 A1 | * | 2/2015 | Matsushita | H01L 24/40 219/121.64 |
| 2016/0035646 A1 | * | 2/2016 | Soyano | H01L 23/36 257/692 |
| 2016/0106010 A1 | * | 4/2016 | Ito | H05K 7/20854 361/707 |

FOREIGN PATENT DOCUMENTS

JP   WO 2015045648 A1 * 4/2015 ............. H01L 23/36

OTHER PUBLICATIONS

Soyano Shin; Semiconductor Device, method for assembling semiconductor device, component for semiconductor device and unit module; Translation date Nov. 1, 2016; Translated from worldwide. Espacenet.com.*

* cited by examiner

*Primary Examiner* — James Wu
*Assistant Examiner* — Michael Matey
(74) *Attorney, Agent, or Firm* — Yunling Ren (57) ABSTRACT

The present disclosure provides a heat spreader and a power module. The heat spreader comprises: a base plate comprising a first surface and a second surface opposite to the first surface; an insulating frame fixedly connected to the first surface of the base plate; and an insulating material attached to at least a part of a surface of the insulating frame. The present disclosure can effectively satisfy design requirements for both heat dissipation and insulation, and significantly increase a layout space for a printed circuit board.

5 Claims, 12 Drawing Sheets

HEAT SPREADER AND POWER MODULE

CROSS REFERENCE

This application is based upon and claims priority to Chinese Patent Application No. 201520588015.4, filed on Aug. 6, 2015, the entire contents thereof are incorporated herein by reference.

TECHNICAL FIELD

The present invention generally relates to insulation between conductive devices, and specifically to a heat spreader and a power module comprising the heat spreader.

BACKGROUND

The requirement for miniaturization of power modules forces power density of the power modules to be increasingly improved. Accordingly, design requirements for heat dissipation are increasing, and many power modules usually have a heat spreader to satisfy the requirement for heat dissipation. Generally, a piece of a metal plate serves as a heat spreader, and fins may be disposed on a side of the metal plate away from a power convertor in the power module, so as to achieve better effect of heat dissipation. Another side of the heat spreader close to the power convertor is a plat surface or comprises several step planes, so as to meet requirements for arrangement of different devices and heat dissipation. Meanwhile, generally a thermal conductive insulating material should be attached onto the side of the heat spreader close to the power convertor, so as to meet requirements for insulation between the conductive devices of the power convertor and heat spreader.

Figure 1:
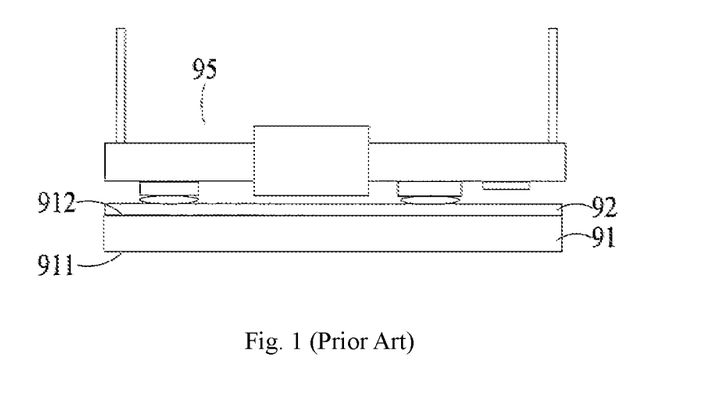
FIG. 1 shows a design of a heat spreader for a power module in related art.

In a heat spreader 91 of the related art, as shown in FIG. 1, one side of the heat spreader away from a power convertor 95, i.e., a lower surface 911 of the heat spreader 91 in FIG. 1, is a flat surface, and fins (not shown) may be disposed on this surface, so as to achieve better effect of heat dissipation. Moreover, another side of the heat spreader close to the power convertor 95, i.e., an upper surface 912 of the heat spreader 91 in FIG. 1, may be a plat surface or comprise several step planes, so as to meet requirements for arrangement of different devices and heat disipation. Meanwhile, generally a thermal conductive insulating material 92 should be attached onto the side close to power convertor 95, so as to meet requirements for insulation between the conductive devices of the power convertor 95 and the metal heat spreader.

Nowadays, there are certain requirements for insulation of the conductive devices on the borders of the heat spreader in the power module, i.e., for a creepage distance between the conductive devices on borders of the power convertor and the heat spreader. However, although the existing design for heat spreader may satisfy different requirements for heat dissipation of power modules, in order to satisfy requirements for insulation of borders of the heat spreader, the layout space for the devices on the printed circuit board has to be reduced, or a volume of the power module has to be increased.

Figure 2:
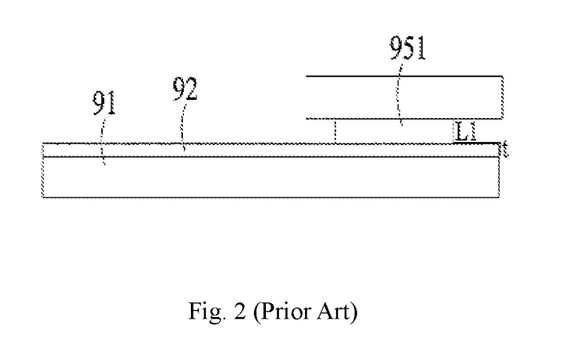
FIG. 2 is a schematic diagram showing a creepage distance of the power module in FIG. 1.

As shown in FIG. 2, in the heat spreader 91 of the related art, the creepage distance between the conductive device 951 in a border of the power convertor 95 and the metal heat spreader 91 is only a sum of a thickness t of the insulating material 92 and a horizontal distance L1 from an end of an upper surface of the thermal conductive insulating material to a right border of the conductive device 951. In order to satisfy requirement for the creepage distance, normally it is required to increase L1, for example, by reducing the printed circuit board or increasing the size of the heat spreader, however, reducing the printed circuit board may result in a reduced layout space for the devices on the printed circuit board, and increasing the size of the heat spreader may result in an increased volume of the power module.

Therefore, a new heat spreader is needed to be developed to solve the technical problems mentioned above.

SUMMARY

Aiming to the problems of the related all, an object of the present disclosure is to provide a heat spreader.

Another object of the present disclosure is to provide a power module comprising the heat spreader of the present disclosure.

In order to realize the objects, the present disclosure provides the followings:

A heat spreader connected to a power converter comprising:

a base plate, comprising a first surface and a second surface opposite to the first surface;

an insulating frame, fixedly connected to the first surface of the base plate; and an insulating material, attached to at least a part of a surface of the insulating frame to increase a creepage distance between a conductive device close to a border of the power convertor and the base plate.

The object of the present disclosure may also be realized by the following solution:

a heat spreader connected to a power converter comprising:

a base plate, comprising a find surface and a side surface connected to the first surface;

an insulating material, attached to the first surface and extended to be attached to at least a part of the side surface to increase a creepage distance between a conductive device close to a border of the power converter and the base plate; and an insulating frame, comprising a vertical part that is fixedly connected to the insulating material attached to the first surface ad the side surface.

The power module of the present disclosure comprises:

a power convertor, comprising a printed circuit board and several devices, the several devices being disposed on the printed circuit board; and the heat spreader of the present disclosure for heat dissipation of the power convertor.

Since the present disclosure utilizes one additional plastic frame and a thermal conductive insulating material attached inside to satisfy different requirements for the creepage distance, the present disclosure provides beneficial effects. More specifically, as compared with the related art, the present disclosure has at least one of the following advantages:

1. requirements for heat dissipation of the module can be satisfied;
2. requirements for different creepage distances can be met; and
3. an easy assembly process, a controllable quality, and a lower cost.

DETAILED DESCRIPTION

Typical embodiments which can embody features and advantages of the present disclosure will be described in detail herein below. It is to be recognized that the present disclosure may be varied in different embodiments without departure the present disclosure. Moreover, it should be clearly understood that the description and drawings serve for illustrating, rather than limiting the present disclosure.

The heat spreader of the present disclosure has function of insulating and can be used for the power module of the present disclosure. The power module in the embodiment of the present disclosure may have the heat spreader of the present disclosure. However, the heat spreader of the present disclosure is not limited to be used in a power module, rather, it can be used in different modules having some other function.

Heat spreaders in a plurality of the embodiments of the present disclosure will be introduced hereinbelow.

Figure 3:
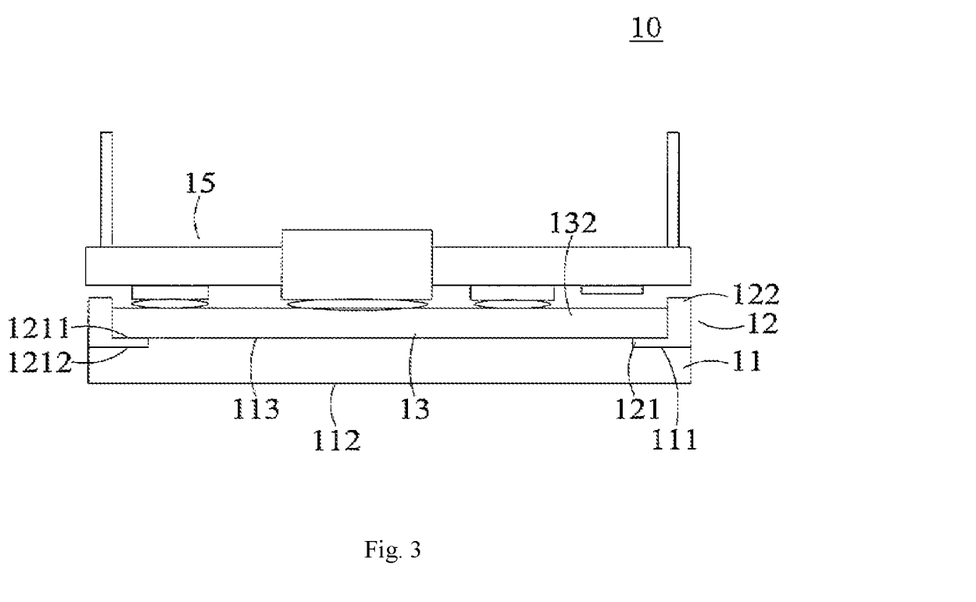
FIG. 3 is a schematic diagram showing a heat spreader in an embodiment of the present disclosure.

As shown in FIG. 3, a schematic diagram showing a heat spreader of the present disclosure, the heat spreader comprises a metal base plate 11, a plastic frame 12, and an insulating material 13. The metal base plate 11 is a component for heat dissipation. The metal base plate 11 has an upper or first surface 111 and a lower or second surface 112, which face to each other. On the surface of the metal base plate 11 away from a power convertor 15, i.e., the lower surface 112 of the metal base plate 11, a heat dispassion device such as fins may be additionally disposed to improve heat dispassion effect. The plastic frame 12 is fixedly connected onto the metal base plate 11. The insulating material 13 is attached to at least a part of a surface of the plastic frame 12.

The metal base plate 11 of the present disclosure may be formed by other heat conductive materials, e.g., a base plate of an alloy.

The plastic frame 12 of the present disclosure may be an insulating frame of other insulating materials.

As shown in FIG. 3, in the embodiment, the plastic frame 12 comprises a horizontal part 121 and a vertical part 122, which form an angle therebetween. In the embodiment, the horizontal part 121 is perpendicular to the vertical part 122, that is, they form a shape of "L." The horizontal part 121 comprises an upper surface 1211 and a lower surface 1212, which face to each other. The lower surface 1212 is fixedly connected to the upper surface 111 of the metal base plate 11, and the vertical part 122 is disposed at a periphery of all the devices of the power convertor 15. In this way, the plastic frame 12 surrounds the power convertor 15. However, the present disclosure is not limited to this, the plastic frame 12 may partially surrounds the power convertor 15. In the embodiment, the metal base plate 11 may further comprises a third surface 113 which is parallel to the first surface 111 and is opposite to the second surface 112. And in the embodiment, the third surface 113 of the metal base plate 11 is flush with the upper surface 1211 of the horizontal part 121 of the plastic frame 12, and the insulating material 13 is attached to the third surface 113 of the metal base plate 11 and the upper surface 1211 of the horizontal part 121 of the plastic frame 12.

Figure 4:
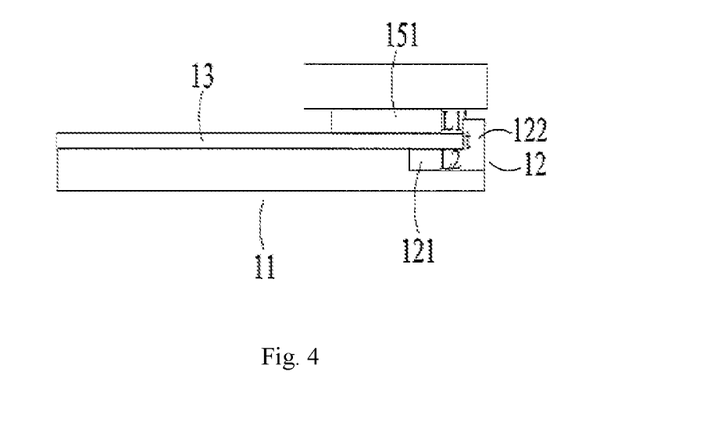
FIG. 4 is a schematic diagram showing a creepage distance of a power module in an embodiment of the present disclosure.

As shown in FIG. 4, a schematic diagram shows a creepage distance of a power module with the heat spreader of FIG. 3, a creepage distance between a conductive device 151 close to a border of a printed circuit board and the metal base plate 11 equals to a sum of L1', t, and L2, where L1' is a horizontal distance between a right border of the conductive device 151 and the vertical part 122 of the plastic frame 12, t is a thickness of the insulating material 13, and L2 is a length of the insulating material 13 attached to the upper surface 1211 of the horizontal part 121 of the plastic frame 12. Moreover, for the power module of the related art shown in FIG. 2, the creepage distance is a sum of the thickness t of the insulating material 92 and a horizontal distance L1 between an end of the upper surface of the insulating material 92 and the right border of the conductive device 951. If the power modules require the same creepage distance, because in the heat spreader of the present disclosure, L1' can be shortened by increasing L2, L1'<L1 can be achieved. In this way, by using the heat spreader of the present disclosure, in case that the volume of the power module is kept the same, a layout space of the printed circuit board can be increased, thus flexibility for layout of the printed circuit board will be increased. Or in case that the layout space of the printed circuit boards is kept the same, an area of the metal base plate 11 can be decreased, thus the volume of the power module will be reduced.

Moreover, by the way of adjusting L2, that is, adjusting the length of the horizontal part 121 of the plastic frame 12, different requirements for creepage distances can be satisfied. Particularly, for the products of the power modules with high-voltage insulations, L1' can be properly reduced while L2 is being increased, thus space for layout of the printed circuit board will be saved, so that effect of the insulation requirements on the layout space of the printed circuit board is significantly reduced, and the creepage distance can be increase, too.

In addition, the insulating material 13 may be attached to a part of the upper surface 1211 of the horizontal part 121 of the plastic frame 12. In this way, the length of the insulating material 13 attached to the upper surface 1211 of the horizontal part 121 of the plastic frame 12 can be adjusted in order to adjust lengths L1' and L2, so as to satisfy different requirements for the creepage distance.

In the heat spreader of the present disclosure, the third surface 113 of the metal base plate 11 and the upper surface 1211 of the horizontal part 121 of the plastic frame 12 may not be in the same plane.

Figure 5:
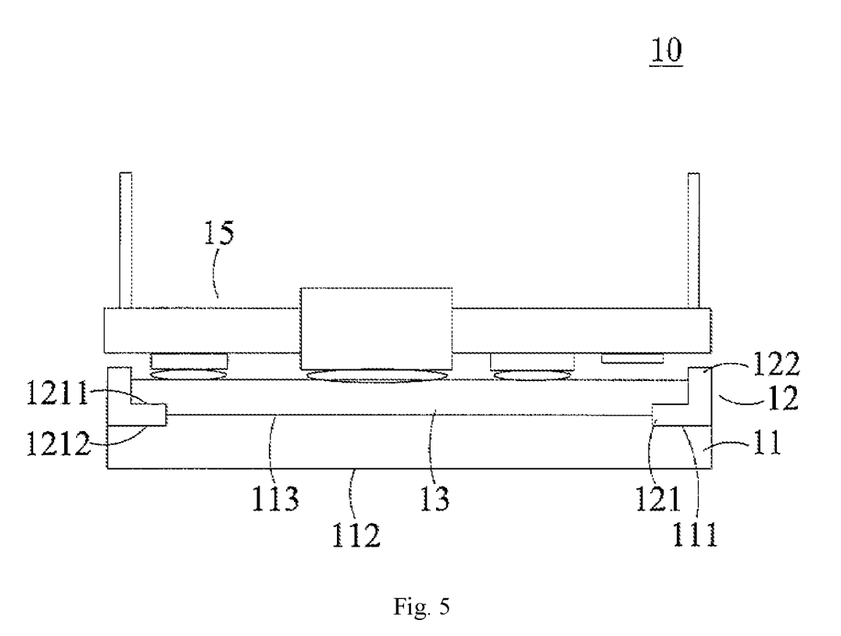
FIG. 5 is a schematic diagram showing a heat spreader in another embodiment of the present disclosure.

FIG. 5 shows a schematic diagram of the heat spreader in another embodiment of the present disclosure, the lower surface 1212 of the plastic frame 12 is fixedly connected to the upper surface 111 of the metal base plate 11, and the upper surface 1211 of the horizontal part 121 of the plastic frame 12 is higher than the third surface 113 of the metal base plate 11, moreover, the vertical part 122 of the plastic frame 12 is disposed at periphery of all devices on the power convertor 15. In this way, the creepage distance between the conductive device 151 and the metal base plate 11 may further comprise a height of the upper surface 1211 of the horizontal part 121 of the plastic frame 12 above the third surface 113 of the metal base plate 11.

Figure 6:
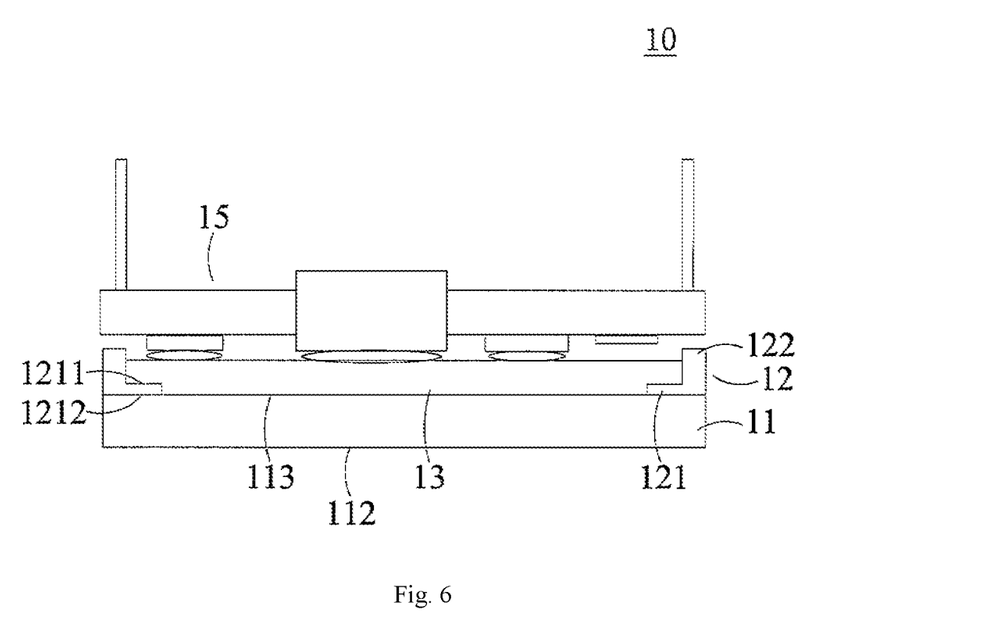
FIG. 6 is a schematic diagram showing a heat spreader in another embodiment of the present disclosure.

In an embodiment, FIG. 6 shows a schematic diagram of the heat spreader in another embodiment of the present disclosure, the lower surface 1212 of the plastic frame 12 is fixedly connected to a part of the upper surface 111 of the metal base plate 11, and a height of the upper surface 1211 of the horizontal part 121 of the plastic frame 12 in respect to the first surface 111 of the metal base plate 11 is the same as a thickness of the horizontal part 121 of the plastic frame 12, moreover, the vertical part 122 of the plastic frame 12 is disposed at a periphery of all devices on the power convertor 15. In this way, the creepage distance between the conductive device 151 and the metal base plate 11 may further comprise a thickness of the horizontal part 121 of the plastic frame 12. Or in the other embodiments, the upper surface 1211 of the horizontal part 121 of the plastic frame 12 may be lower than the third surface 113 of the metal base plate 11, and the vertical part 122 of the plastic frame 12 is disposed at periphery of all devices on the power convertor 15. In this way, a height difference between the upper surface 1211 of the horizontal part 121 of the plastic frame 12 and the third surface 113 of the metal base plate 11 may be adjusted, or the thickness of the horizontal part 121 of the plastic frame 12 may be adjusted, so as to adjust the creepage distance between the conductive device 151 and the metal base plate 11.

Figure 7:
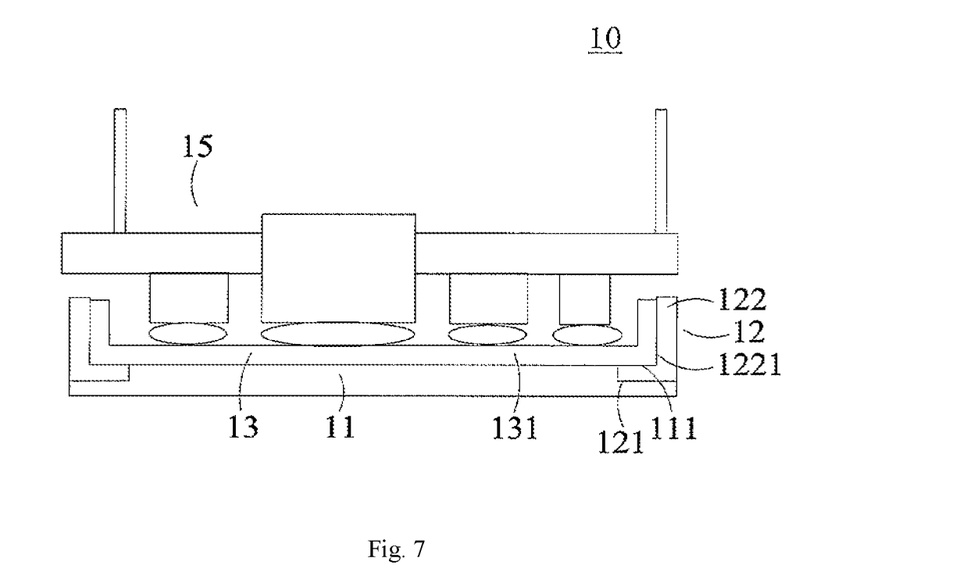
FIG. 7 is a schematic diagram showing a heat spreader in another embodiment of the present disclosure.

In an embodiment, the insulating material 13, which is attached to the horizontal part 121 of the plastic frame 12 in the previous embodiments, may be extended to be attached to at least a part of the vertical part 122 of the plastic frame 12. FIG. 7 shows a schematic diagram of the heat spreader in another embodiment of the present disclosure, the insulating material 13 attached to the horizontal part 121 of the plastic frame 12 is further extended to be attached to at least a part of an inside surface 1221 of the vertical part 122 of the plastic frame 12. In this way, by adjusting the height of the insulating material 13 extendedly attached to the inside surface 1221 of the vertical part 122 of the plastic frame 12, the creepage distance between the conductive device 151 and the metal base plate 11 can be adjusted, too.

Returning to FIGS. 3, 4, 5 and 7, the lower surface 1212 of the horizontal part 121 completely covers the first surface 111 of the metal base plate 11; however, the present disclosure is not limited to this, and also, the lower surface 1212 of the horizontal part 121 may partially covers the first surface 111.

Figure 8:
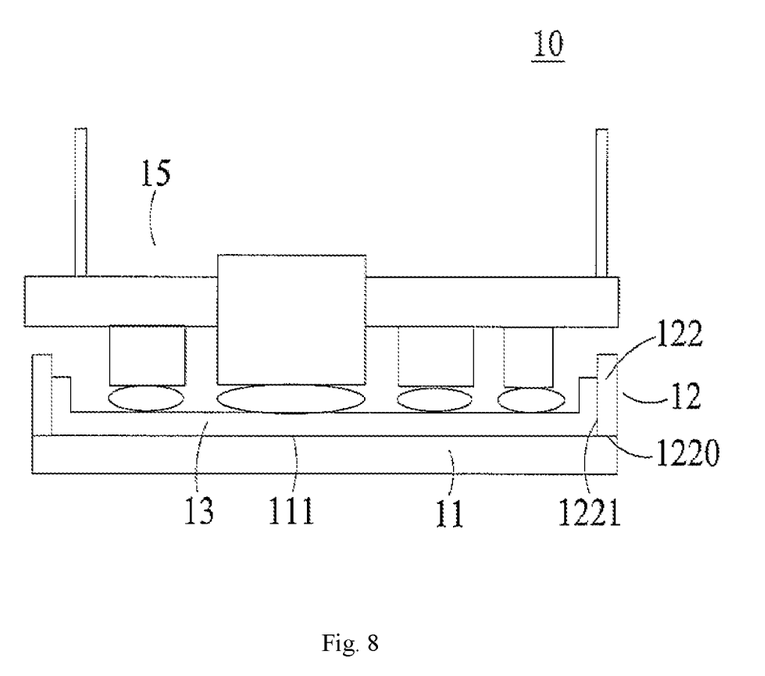
FIG. 8 is a schematic diagram showing a heat spreader in another embodiment of the present disclosure.

Furthermore, the shape of the plastic frame 12 is not limited to L-shape, as illustrated in the previous embodiments. As shown in FIG. 8, in the heat spreader in another embodiment of the present disclosure schematic diagram, the plastic frame 12 may be shaped as I, that is, the plastic frame comprises the vertical part 122 only which is disposed at a periphery of all devices on the power convertor 15. In this way, the plastic frame 12 surrounds the power convertor 15.

The vertical part 122 may comprise an end 1220 and an inside surface 1221.

The vertical part 122 is fixedly connected onto the metal base plate 11, for example, the end 1220 is fixed to the first surface 111 of the metal base plate 11, thus an angle is formed between the metal base plate 11 and the vertical part 122. The angle between the metal base plate 11 and the vertical part 122 is not limited, that is, the angle between them is not limited to be a right angle, rather the degree of the angle is not limited.

In this embodiment, the insulating material 13 is attached to the first surface 111 of the metal base plate 11 and is extended to be attached to at least a part of the inside surface 1221 of the vertical part 122 of the plastic frame 12.

In this way, on the power convertor 15, the creepage distance between the conductive device 151 close to a border of the printed circuit board and the metal base plate 11 equals to a sum of L1', 2t, and 2×L2, where L1' is a horizontal distance between a right border of the conductive device 151 and the insulating material 13 attached to the vertical part 122 of the plastic frame 12, t is a thickness of the insulating material 13, and L2 is a height of the insulating material 13 attached to the inside surface 1221 of the vertical part 122 of the plastic frame 12. Moreover, the creepage distance may be adjusted by any of L1', t, and L2.

Figure 9:
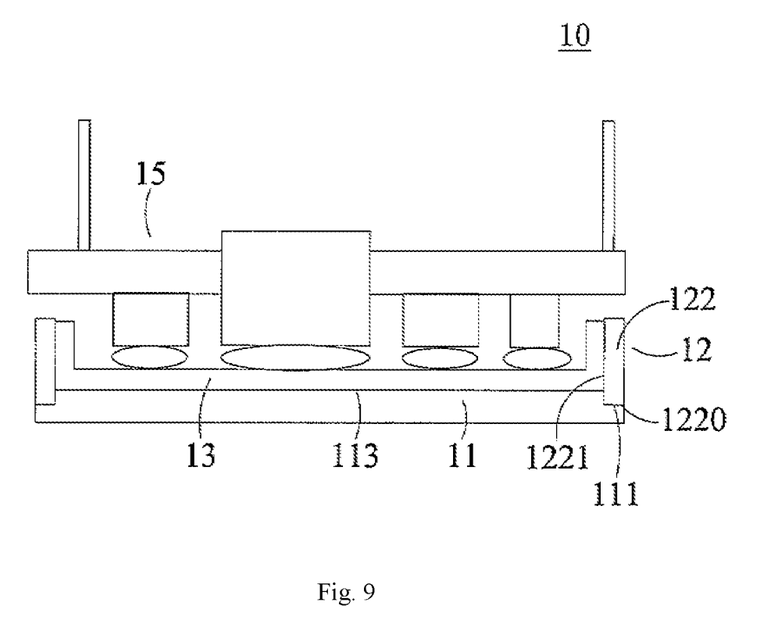
FIG. 9 is a schematic diagram showing a heat spreader in another embodiment of the present disclosure.

In an embodiment, FIG. 9 shows a schematic diagram of the heat spreader in another embodiment of the present disclosure, the metal base plate 11 may further comprise the third surface 113 which is parallel to the first surface 111. The end 1220 of the vertical part 122 is fixed to the first surface 111 of the metal base plate 11. The inside surface 1221 of the vertical part 122 may be fixedly connected to connecting parts of the third surface 113 and the first surface 111, however, the end of the vertical part may be not fixedly connected to connecting parts of the third surface 113 and the first surface 111, the present disclosure is not limited in this respect. The insulating material 13 is attached to the third surface 113 of the metal base plate 11 and is extended to be attached to at least a part of the inside surface 1221 of the vertical part 122 of the plastic frame 12, or partially attached to the first surface 111 of the metal base plate 11 at the same time.

Figure 10:
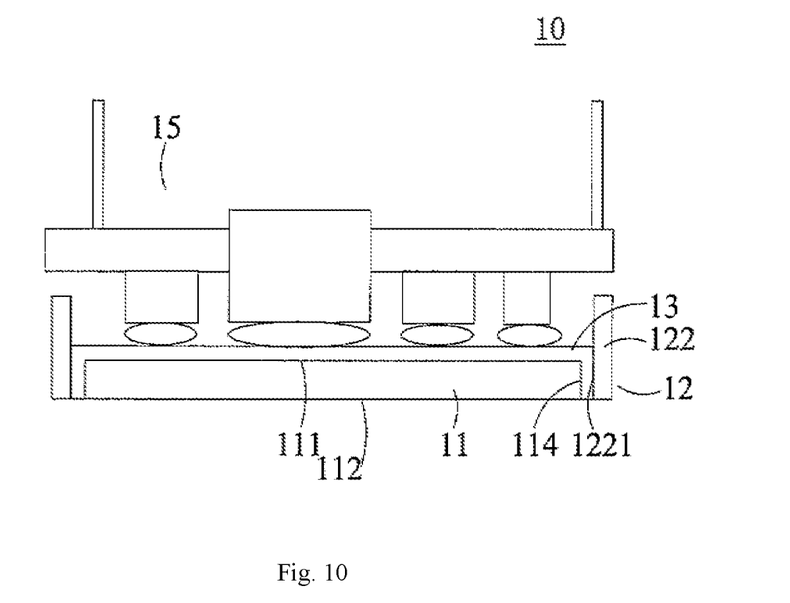
FIG. 10 is a schematic diagram showing a heat spreader in another embodiment of the present disclosure.

In an embodiment, FIG. 10 shows a schematic diagram of the heat spreader in another embodiment of the present disclosure, the metal base plate 11 comprises a first surface 111 and a side surface 114 connected to the first surface 111.

The insulating material 13 is attached to the first surface 111 of the metal base plate 11, and is extended to be attached to at least a part of the side surface 114 of the metal base plate 11. The plastic frame 12 is fixedly connected to the insulating material 13 attached to the side surface 114 of the metal base plate 11. In this way, on the power convertor 15, the creepage distance between the conductive device 151 close to a border of the printed circuit board and the metal base plate 11 equals to a sum of L1', 2t, and L2, where L1' is a horizontal distance between a right border of the conductive device 151 and the vertical part 122 of the plastic frame 12, t is a thickness of the insulating material 13, and L2 is a height of the insulating material 13 attached to the side surface 114 of the metal base plate 11. Therefore, the creepage distance may be adjusted by any of the three parameters. In an embodiment, the insulating material 13 may be additionally extended to be attached to the second surface 112 of the metal base plate 11, where the second surface 112 and the first surface 111 may be opposite to each other. In an embodiment, the insulating material 13 is only attached to a part of the side surface 114 of the metal base plate 11, and the plastic frame 12 is fixedly connected to the insulating material 13, which is attached to the side surface 114 of the metal base plate 11, and a part of side surface 114 of the metal base plate 11.

Figure 11:
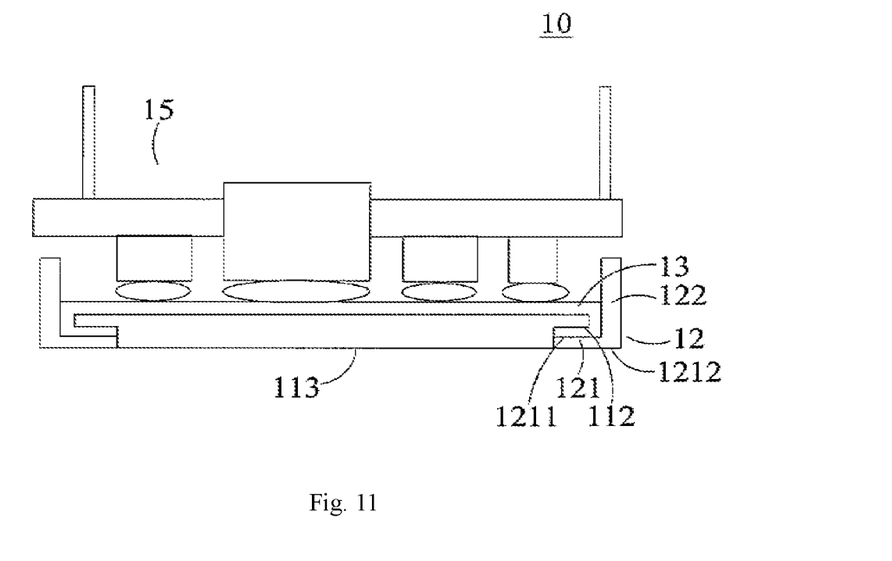
FIG. 11 is a schematic diagram showing a heat spreader in another embodiment of the present disclosure.

Further, as shown in FIG. 10, the metal base plate 111 further comprises a third surface 113, and the plastic frame 12 further comprises a horizontal part 121. More specially, FIG. 11 shows a schematic diagram of the heat spreader in another embodiment of the present disclosure. The third surface 113 is parallel to the second surface 112, and is opposite to the first surface 111. The insulating material 13, which is attached to the first surface 111 of the metal base plate 11 and the side surface 114 of the metal base plate 11, is additionally extended to be attached to at least a part of the second surface 112 of the metal base plate 11. The horizontal part 121 of the plastic frame 12 comprises a upper surface 1211 and a lower surface 1212, and the upper surface 1211 of the horizontal part 121 is further fixedly connected to the insulating material 13 attached to the second surface 112 of the metal base plate 11. In this way, on the power convertor 15, the creepage distance between the conductive device 151 close to a border of the printed circuit board and the metal base plate 11 further comprises a length of the insulating material 13 attached to the second surface 112 of the metal base plate 11. Further, the upper surface 1211 of the horizontal part 121 may be extended to be fixed to the second surface 112 of the metal base plate 11. If the upper surface 1211 of the horizontal part 121 is further extended to be fixed to the second surface 112 of the metal base plate 11, then on the power convertor 15, the creepage distance between the conductive device 151 close to a border of the printed circuit board and the metal base plate 11 further comprises a thickness of the insulating material 13. Moreover, the creepage distance may be adjusted by any of these parameters.

In the embodiment, the lower surface 1212 of the horizontal part 121 of the plastic frame 12 is flush with third surface 113 of the metal base plate 111, however, the present disclosure is not limited to this.

Figure 12:
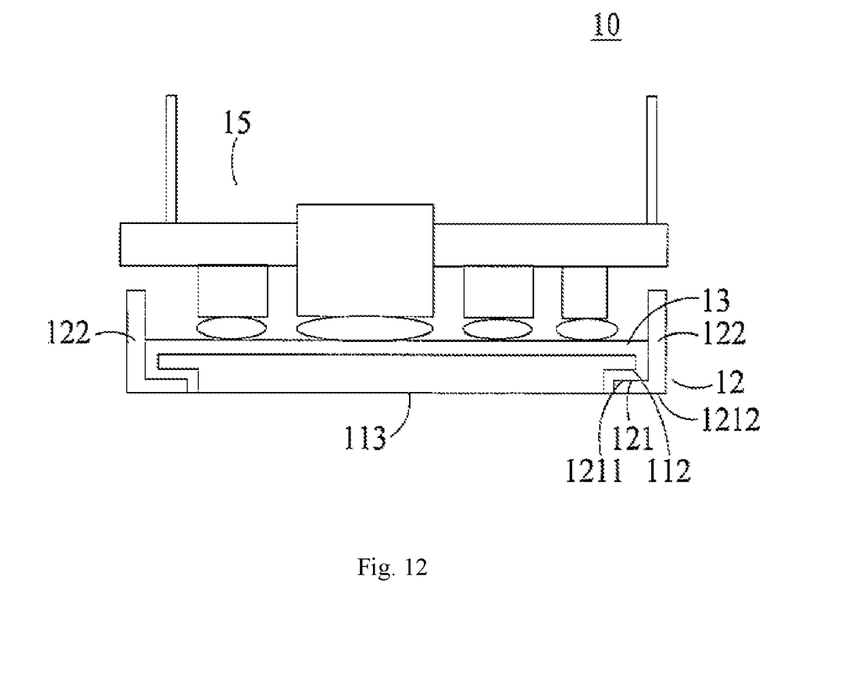
FIG. 12 is a schematic diagram showing a heat spreader in another embodiment of the present disclosure.

FIG. 12 shows a schematic diagram of the heat spreader in another embodiment of the present. Different from FIG. 11, in this embodiment, the insulating material 13 is further extended to be attached to connecting parts of the second surface 112 of the metal base plate 11 and the third surface 113. So the creepage distance between the conductive device 151 close to a border of the printed circuit board and the metal base plate 11 further comprises a length of the insulating material 13 attached to connecting parts of the second surface 112 of the metal base plate 11 and the third surface 113 and a thickness of the insulating material 13. However, the present disclosure is not limited to this, the insulating material 13 may also be partially attached to connecting parts of the second surface 112 of the metal base plate 11 and the third surface 113.

In the embodiment, the horizontal part 121 of the plastic frame 12 is not limited to be perpendicular to the vertical part 122, that is, the shape of the plastic frame 12 is not limited to L. In an actual design, the angle between the horizontal part 121 and the vertical part 122 may be adjusted, for example, to be an obtuse angle or acute angle, the present disclosure has no limit in this respect.

In the embodiment, a cross section of the plastic frame 12 may be rectangle, round or other shape, the present disclosure has no limit in this respect.

In the embodiment, the upper surface 1211 of the horizontal part 121 of the plastic frame 12 and the inside surface 1221 of the vertical part 122 may be a bendable surface, such as having certain waves, projections or depressions, so as to increase the length of the surface attaching to the upper surface 1211 of the horizontal part 121 or the inside surface 1221 of the vertical part 122, thus increasing the creepage distance.

In the present disclosure, the plastic frame 12 may be fixedly connected to the metal base plate 11 or the insulating material 13 by pressing connection, bonding connection, clamping connection, or any other connection, the present disclosure does not limit in this respect.

In the present disclosure, the insulating material 13 is a thermal conductive material, and may be a single layer, two layers or multilayers, so as to satisfy different requirements for the creepage distances and thermal conductivity. For the insulating material 13 attached to the metal base plate 11 and the plastic frame 12, the insulating material may be a single piece or made up by multiple pieces. One piece of the insulating material 13 may be attached to all the parts required to be attached, alternatively, multiple pieces of the insulating material 13 may be attached to different parts separately. The value oft (the thickness of the insulating material 13) can be adjusted by selecting multilayers or a single layer of the insulating material 13, that is, the creepage distance can be adjusted.

In an embodiment of the present disclosure, the heat spreader of the present disclosure can be applied in a power module 10 comprising a power convertor 15. The layout space for the printed circuit board of the power convertor 15 can be saved or the area of the metal base plate 11 can be reduced by applying the heat spreader of the present disclosure, thus the power density of the power module will be improved.

Conclusively, the present disclosure can provide at least one of the following advantages: the metal base plate 11, the plastic frame 12, and the insulating material 13 are combined such that the insulating material 13 can be a good attachment carrier, and the creepage distance of the power module can be adjusted according to requirement. Therefore, the heat spreader in embodiments of the present disclosure can effectively satisfy the existing design requirements for both heat dissipation and insulation of the power module. Moreover, the layout space for the printed circuit board can be saved more significantly by such design, particularly to those products having special requirements for high voltage insulation. In respect to traditional design, the power density of the products of the present disclosure can be increased more effectively, and the products can be assembled more simply, thus cost of those products may be further reduced.

A person skilled in the art would appreciate that any modifications and other changes without departure the scope and principle of the present disclosure will fall to the protecting scopes of claims of the present disclosure.

What is claimed is:

1. A heat spreader connected to a power convertor comprising:
   a base plate comprising a first surface and a side surface, and the side surface is connected to the first surface;
   an insulating material, being attached to the first surface and extended to be attached to at least a part of the side surface to increase a creepage distance between a conductive device close to a border of the power convertor and the base plate; and
   an insulating frame, comprising a vertical part, which is fixedly connected to the insulating material attached to the first surface and the side surface,
   wherein the insulating material is positioned between the power convertor and the base plate, and wherein insulating frame is positioned between the power convertor and the base plate.

2. The heat spreader according to claim 1, wherein the base plate comprises a second surface, which is opposite to the first surface and is connected to the side surface, and the insulating material is further extended to be attached to at least a part of the second surface.

3. The heat spreader according to claim 2, wherein the insulating frame further comprises a horizontal part, which is connected to the vertical part and is fixedly connected to the insulating material attached to the second surface.

4. The heat spreader according to claim 1, wherein the base plate further comprises a second surface and a third surface which is parallel to the second surface and is opposite to the first surface, and the third surface is connected to the second surface via a connecting part, and the insulating material is further extended to be attached to at least a part of the connecting part.

5. A power module comprising:

the power convertor, comprising a printed circuit board and several devices, the several devices being disposed on the printed circuit board; and the heat spreader of claim 1 for heat dissipation of the power convertor.

* * * * *